United States Patent
Lee et al.

(10) Patent No.: US 11,002,768 B2
(45) Date of Patent: May 11, 2021

(54) METHOD AND APPARATUS FOR DETECTING CURRENT USING OPERATIONAL AMPLIFIER

(71) Applicant: Mando Corporation, Pyeongtaek-si (KR)

(72) Inventors: Su-Min Lee, Siheung-si (KR); ChungKwon Lee, Seongnam-si (KR)

(73) Assignee: MANDO CORPORATION, Pyeongtaek-si (KR)

( * ) Notice: Subject to any disclaimer, the term of this patent is extended or adjusted under 35 U.S.C. 154(b) by 143 days.

(21) Appl. No.: 16/517,805

(22) Filed: Jul. 22, 2019

(65) Prior Publication Data
US 2020/0025806 A1 Jan. 23, 2020

(30) Foreign Application Priority Data
Jul. 20, 2018 (KR) .................. 10-2018-0084487

(51) Int. Cl.
*G01R 19/00* (2006.01)
*H03F 3/45* (2006.01)

(52) U.S. Cl.
CPC .......... *G01R 19/0092* (2013.01); *H03F 3/45* (2013.01); *H03F 2200/462* (2013.01); *H03F 2203/45151* (2013.01)

(58) Field of Classification Search
CPC .............. G01R 15/185; G01R 19/0092; G01R 15/205; G01R 15/20; G01R 33/09; G01R 15/202; G01R 15/207; G01R 31/008; G01R 33/04; G01R 33/07; G01R 33/093; G01R 33/096; G01R 33/098; G01R 33/3815; G01R 19/20; G01R 31/28; G01R 31/2818; G01R 31/50; G01R 31/52; G01R 33/0023; G01R 33/0035; G01R 33/0041; G01R 33/0082; G01R 33/072; G01R 35/00; G01R 15/08; G01R 15/142; G01R 15/183; G01R 1/203; G01R 23/165; G01R 27/20; G01R 31/2834; G01R 31/62; G01R 33/0017; H02P 6/182; H02P 27/06; H02P 7/285; H02P 9/006; H02P 9/02; H02P 25/00;
(Continued)

(56) References Cited

U.S. PATENT DOCUMENTS

| 4,782,305 A * | 11/1988 | Westwick ............ H03H 11/04 330/107 |
| 7,863,840 B2 * | 1/2011 | Tanabe .................. H02P 6/182 318/293 |

(Continued)

*Primary Examiner* — Vinh P Nguyen
(74) *Attorney, Agent, or Firm* — Hauptman Ham, LLP

(57) ABSTRACT

The present disclosure relates to a current detecting apparatus using an operational amplifier and a method thereof. In accordance with an aspect of the present disclosure, there is provided a current detecting apparatus of a conductor including: a shunt resistor connected to the conductor; an operational amplifier connected to the shunt resistor; a first resistor connected between the shunt resistor and a first input terminal of the operational amplifier; a second resistor connected between the shunt resistor and a second input terminal of the operational amplifier; a third resistor connected between a ground and the first input terminal of the operational amplifier; and a fourth resistor connected between the ground and the second input terminal of the operational amplifier.

12 Claims, 4 Drawing Sheets

(58) Field of Classification Search
CPC .... H02P 29/0241; H02P 29/027; H02P 29/60; H02P 6/08; H02P 6/18; H02P 6/21; H02K 19/34; H02K 7/1815; H02K 11/215; H02K 2201/18; H02K 2211/03; H02K 41/03; H02K 41/031; H02K 5/18; H02K 9/10; H02K 9/18; H02K 9/19; H02K 9/22; G06F 7/70; H03F 2200/462; H03F 2203/45151; H03F 3/45; H03F 3/45475
See application file for complete search history.

(56) References Cited

U.S. PATENT DOCUMENTS

| | | | | |
|---|---|---|---|---|
| 9,713,089 B2* | 7/2017 | Hamada | ............... | H04B 5/0031 |
| 10,515,749 B2* | 12/2019 | Noyes | ................... | H02H 7/001 |
| 10,784,810 B1* | 9/2020 | Lu | ..................... | G01R 19/0092 |
| 10,833,621 B2* | 11/2020 | Fujita | .................... | G01R 31/42 |
| 2020/0057120 A1* | 2/2020 | Belin | .................. | G01R 15/207 |

* cited by examiner

METHOD AND APPARATUS FOR DETECTING CURRENT USING OPERATIONAL AMPLIFIER

CROSS REFERENCE TO RELATED APPLICATION

This application claims priority from Korean Patent Application No. 10-2018-0084487, filed on Jul. 20, 2018, which is hereby incorporated by reference for all purposes as if fully set forth herein.

BACKGROUND OF THE INVENTION

1. Field of the Invention

The present disclosure relates to a current detecting apparatus using an operational amplifier (Op. Amp.) and a method thereof, and more particularly, to an apparatus and method for detecting a current flowing through a conductor using a shunt resistor connected to the conductor flowing the current and the operational amplifier connected to both ends of the shunt resistor.

2. Description of the Prior Art

Recently, various functions are provided for the convenience of the driver in a vehicle, and various advanced sensing sensors and electronic control devices are mounted to realize these functions.

Meanwhile, the vehicle is provided with an electronic power steering (EPS) device to easily steer the steering wheel, and the electric power steering device may assist the steering force of the driver by using the rotational force of the motor.

The motor described above may be connected to the H-bridge circuit and may be operated by the current applied through the H-bridge circuit. At this case, in order to secure the safety of the motor, the current detecting device for measuring the current applied to the motor may be required. At this time, there may be an increasing need to provide the current detecting device capable of stably measuring the current at the case of overvoltage while reducing the cost.

SUMMARY OF THE INVENTION

For this background, the present disclosure may provide a current detecting device that can measure overcurrent stably even if the overcurrent is applied to the conductor at a minimum cost.

In accordance with an aspect of the present disclosure, there is provided a current detecting apparatus of a conductor including: a shunt resistor connected to the conductor; an operational amplifier connected to the shunt resistor; a first resistor connected between the shunt resistor and a first input terminal of the operational amplifier; a second resistor connected between the shunt resistor and a second input terminal of the operational amplifier; a third resistor connected between a ground and the first input terminal of the operational amplifier; and a fourth resistor connected between the ground and the second input terminal of the operational amplifier.

In accordance with another aspect of the present disclosure, there is provided a current detecting method of a conductor including: applying a current to a shunt resistor connected to the conductor; applying a voltage of a first end of the shunt resistor to a first input terminal of an operational amplifier by being voltage-divided through a first resistor and a third resistor, and applying a voltage of a second end of the shunt resistor to a second input terminal of the operational amplifier by being voltage-divided through a second resistor and a fourth resistor; and determining the current of the conductor based on the voltage of an output terminal of the operational amplifier, wherein the first resistor is connected between the shunt resistor and the first input terminal of the operational amplifier, the second resistor is connected between the shunt resistor and the second input terminal of the operational amplifier, the third resistor is connected between a ground and the first input terminal of the operational amplifier, and the fourth resistor is connected between the ground and the second input terminal of the operational amplifier.

According to the embodiments of the present disclosure, it is possible to provide a current detecting apparatus capable of stably measuring a current at a minimum cost while ensuring current detection accuracy of a certain level or more.

DETAILED DESCRIPTION OF THE EXEMPLARY EMBODIMENTS

Figure 1:
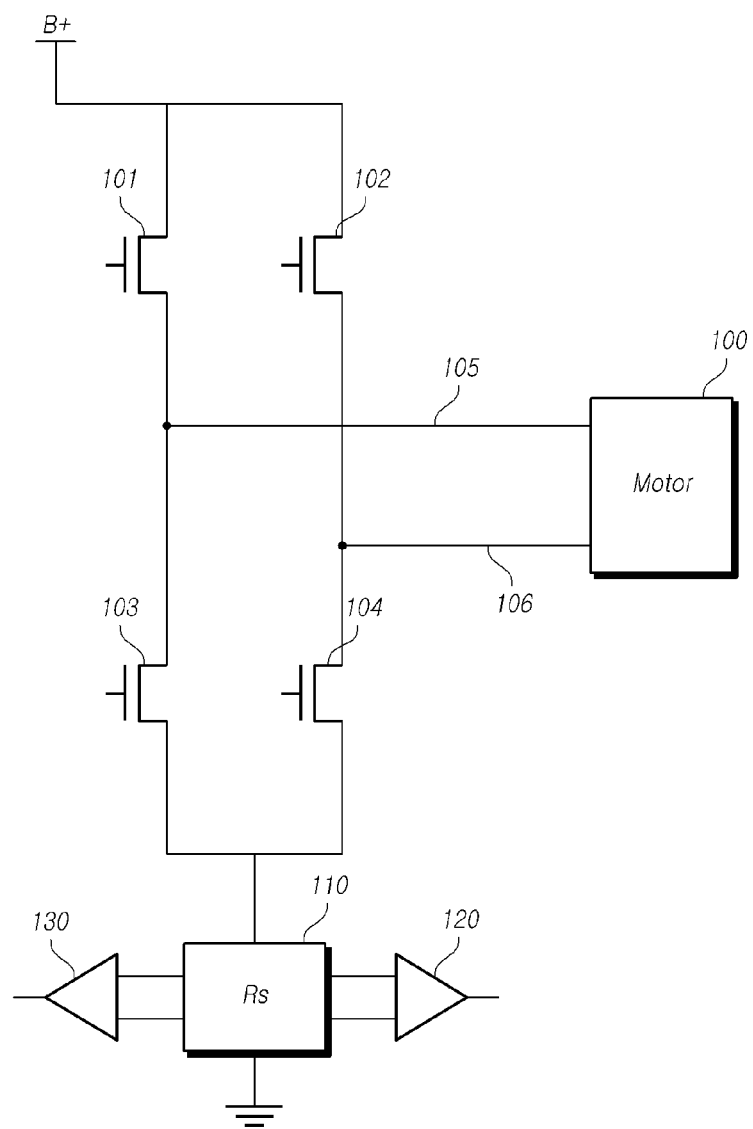
FIG. 1 is a diagram illustrating an example of a device for measuring a current between a low-side transistor and a ground.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram illustrating an example of a device for measuring a current between a low-side transistor and a ground.

Referring to FIG. 1, the current may be applied to the motor 100 through the H-bridge circuit. Two phase lines 105 and 106 may be connected between the motor 100 and the H-bridge circuit. The phase line may mean a conductor or wire connecting the high-side transistor of the H-bridge circuit and the motor.

The high-side transistors 101 and 102 may be positioned between the B+line and the phase lines 105 and 106. In addition, the low-side transistors 103 and 104 may be placed between the phase lines 105 and 106 and GND.

In this case, in order to measure the current flowing between the low-side transistors 103 and 104 and the GND, a shunt resistor 110 may be located between the low-side transistors 103 and 104 and the GND. The currents flowing between the low-side transistors 103 and 104 and the GND can be measured using the operational amplifiers 120 and 130 whose input terminals are connected to both ends of the shunt resistor 110.

In this case, a ground line (GND Line) operational amplifier can be used for the operational amplifiers 120 and 130 described above.

The ground line operational amplifier means an operational amplifier having a terminal connected to the ground (GND), and has an advantage that it is inexpensive.

However, the ground line operational amplifier has the disadvantage that the maximum input possible voltage value, that is, the maximum value (eg 5V) of the voltage value that can be input to the input terminal of the operational amplifier without causing a failure in the operational amplifier is low. That is, if an overvoltage is applied to the ground type operational amplifier, there may be a problem that an error occurs in the current measurement due to a failure in the operational amplifier.

Therefore, the ground line operational amplifier can be used for measuring the current flowing in a conductor whose voltage difference between both ends is not large, such as between the low-side transistors 103 and 104 and the ground (GND).

However, there may be a problem that the ground line operational amplifier is difficult to be used for measuring the current flowing in the conductor, which is likely to have a large voltage difference between the two ends, such as the phase lines 105 and 106. If the current flowing through the conductor with large voltage difference at both ends is measured, the input voltage value input to the operational amplifier may be greater than the maximum input possible voltage value, which may cause an abnormal operation of the operational amplifier.

Figure 2:
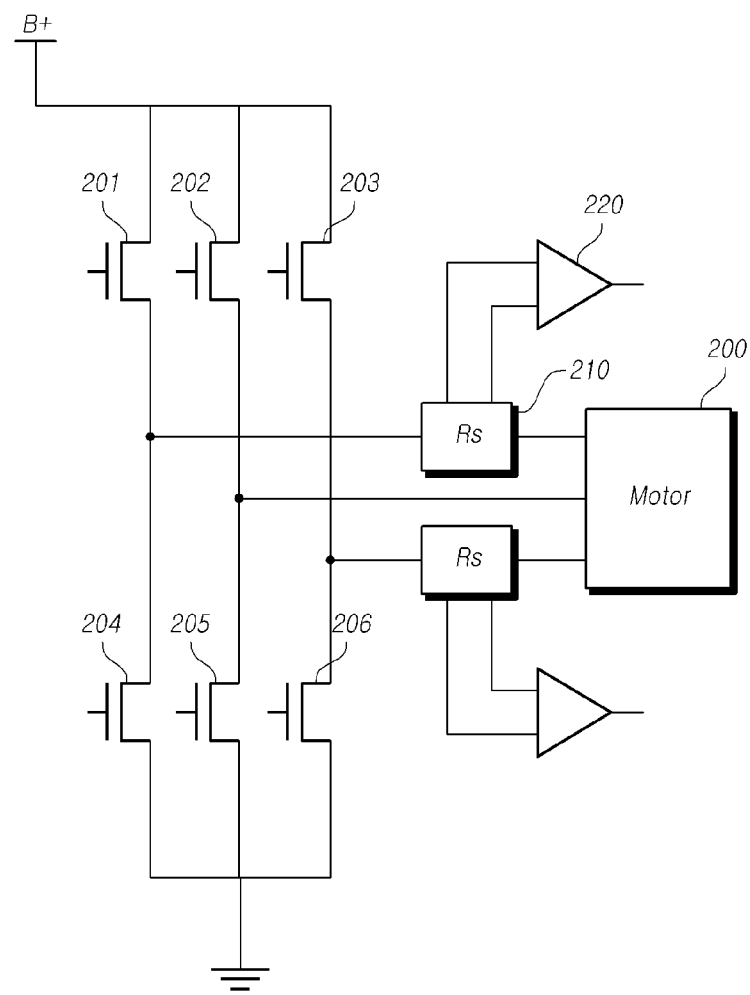
FIG. 2 is a diagram illustrating an example of a apparatus for detecting a current applied to a motor using a floating type operational amplifier (Op. Amp.)

FIG. 2 is a diagram illustrating an example of a apparatus for detecting a current applied to a motor using a floating type operational amplifier.

Referring to FIG. 2, the current may be applied to the motor 200 through the H-bridge circuit. Three phase lines may be connected between the motor 200 and the H-bridge circuit. The high-side transistors 201, 202 and 203 may be positioned between the B+line and the phase line. The low-side transistors 204, 205, and 206 may be placed between the phase line and GND.

In this case, the shunt resistor 210 may be positioned between one high-side transistor 201 and the motor 200 in order to measure the current flowing through the phase line. The current flowing through the phase line can be measured using an operational amplifier 220 whose input terminal is connected to both ends of the shunt resistor 210.

In this case, the operational amplifier 220 may be a floating type operational amplifier.

The floating type operational amplifier means an operational amplifier which is not connected to the ground separately. The floating type operational amplifier has an advantage that the maximum input possible voltage value (e.g., 70 V) described in FIG. 1 is larger than that of the ground line operational amplifier. Therefore, the floating type operational amplifier can be used to measure the current flowing in a conductor where the voltage difference at both ends is likely to be large.

However, the floating type operational amplifier is disadvantageous in that it is more expensive than the ground line operational amplifier. Therefore, if the floating type operational amplifier is used, there may be a problem that the total cost required to implement the current measuring device is increased.

In order to solve the disadvantage of the apparatus for measuring the current applied to the motor of FIGS. 1 and 2, the present disclosure may provide a current detecting apparatus or current measuring apparatus capable of stably measuring a current while using a low-cost ground line operational amplifier.

Figure 3:
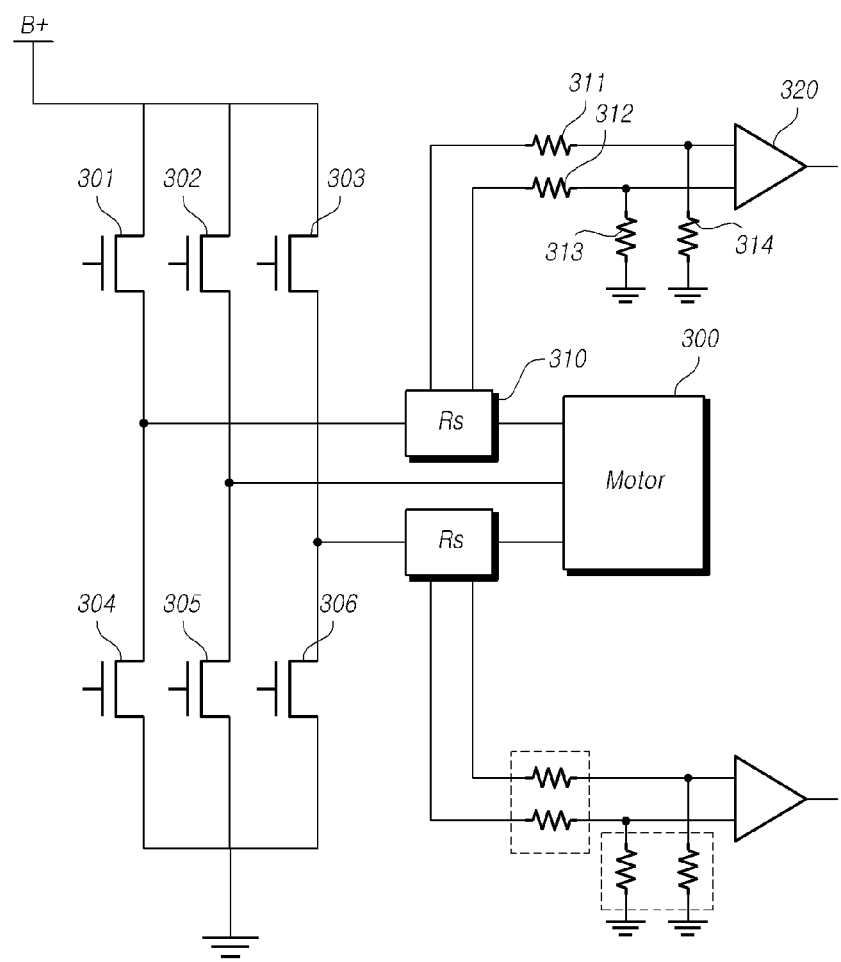
FIG. 3 is a diagram illustrating an example of an apparatus for detecting a current applied to a motor using the ground type operational amplifier.

FIG. 3 is a diagram illustrating an example of an apparatus for detecting a current applied to a motor using the ground type operational amplifier.

Referring to FIG. 3, the current may be applied to the motor 300 through the H-bridge circuit. Three phase lines may be connected between the motor 300 and the H-bridge circuit. The high-side transistors 301, 302 and 303 may be located between the B+line and the phase line. And, the low-side transistors 304, 305 and 306 may be positioned between the phase line and the GND.

In this case, the shunt resistor 310 may be positioned between one high-side transistor 301 and the motor 300 in order to measure the current flowing in the phase line. The current flowing through the phase line can be measured using an operational amplifier 220 whose input terminal is connected to both ends of the shunt resistor 310.

In one example of FIG. 3, the shunt resistors may be located between two high-side transistors 301 and 303 and the motor 300, and one high-side transistor 302 and the motor 300 are directly connected with each other.

In this case, the operational amplifier 320 may be the ground line operational amplifier.

If the ground line operational amplifier is used to measure the current of the phase line, an overvoltage greater than the maximum input possible voltage value can be input to the operational amplifier as described above with reference to FIG. 1. Therefore, it is necessary to reduce the voltage applied to the input terminal of the operational amplifier 320 in comparison with the voltage applied to the shunt resistor 310.

For this purpose, a voltage divider circuit using a resistor can be constructed between the shunt resistor 310 and both input terminals of the operational amplifier 320. That is, the voltage input to the operational amplifier 320 can be divided by the resistor.

More specifically, both ends of the shunt resistor 310 can be referred to as a first end and a second end, respectively. (In this embodiment, the end connected to one high-side transistor 301 is referred to as a first end, and the end connected to the motor 300 is referred to the second end).

The first resistor 311 may be connected between the first end of the shunt resistor 310 and the first input terminal of the operational amplifier 320, and the third resistor 314 may be connected between the ground and the first input terminal of the operational amplifier 320. In this case, the first resistor 311 and the third resistor 314 may be connected in series with each other.

If the voltage value at the first end of the shunt resistor 310 is V, the value of the voltage applied to the first input terminal of the operational amplifier 320 becomes smaller than V, the value of the voltage may be determined by the ratio of the resistance of the first resistor 311 and the resistance of the third resistor 314.

For example, if the ratio of the resistance of the first resistor 311 to the resistance of the third resistor 314 is 1:1, the value of the voltage applied to the first input terminal of the operational amplifier 320 may be V/2.

As another example, if the ratio of the resistance of the first resistor 311 to the resistance of the third resistor 314 is 9:1, the value of the voltage applied to the first input terminal of the operational amplifier 320 may be V/10.

In this case, the ratio of the resistance of the third resistor 314 to the resistance of the first resistor 311 may be set to be equal to or less than a predetermined threshold ratio value. That is, the resistance of the third resistor 314 with respect to the resistance of the first resistor 311 may be adjusted, so that the value of the voltage applied to the first input terminal of the operational amplifier 320 is smaller than the value of the voltage applied to the first input terminal of the operational amplifier 320 at a predetermined threshold ratio value.

For example, if the threshold ratio value is 1/3 (resistance of the first resistor:resistance of the third resistor=3:1), the actual ratio value of the resistance of the third resistor 314 to the resistance of the first resistor 311 may be set to be smaller than 1/3 (e.g., resistance of the first resistor:resistance of the third resistor=5:1).

The magnitude of the threshold ratio value may be determined based on the maximum input possible voltage value of the operational amplifier 320 described above. For example, if the maximum input possible voltage value of the operational amplifier 320 is increased (e.g., from 5V to 10V), the magnitude of the threshold ratio value may also be increased (e.g., from 1/3 to 2/3).

Similarly, the second resistor 312 may be connected between the second end of the shunt resistor 310 and the second input terminal of the operational amplifier 320, and the fourth resistor 313 may be connected between the ground and the second input terminal of the operational amplifier 320. In this case, the second resistor 312 and the fourth resistor 313 may be connected in series with each other.

If the voltage value of the second end of the shunt resistor 310 is V, the value of the voltage applied to the second input terminal of the operational amplifier 320 becomes smaller than V. The value of the voltage applied to the second input terminal of the operational amplifier 320 may be determined by the ratio of the resistance of the second resistor 312 to the resistance of the fourth resistor 313, and may be the same as the relationship between the first resistor 311 and the third resistor 314.

At this time, the ratio of the resistance of the first resistor 311 to the resistance of the third resistor 314 may be set to be equal to the ratio of the resistance of the second resistor 312 to the resistance of the fourth resistor 313. Alternatively, the resistance of four resistors may be set so that the difference between the ratio of the resistance of the third resistor 314 to the resistance of the first resistor 311 and the ratio of the resistance of the fourth resistor 313 to the resistance of the second resistor 312 is less than or equal to the threshold value.

If the difference between the two ratio values is large, a difference occurs between the ratio of the voltage between the both ends of the shunt resistor 310 and the ratio of the voltage between the first input terminal and the second input terminal of the operational amplifier 320 so that the difference in the measured current value with respect to the actual current may become large.

For example, in the case that the resistance of the first resistor 311 is 10 Ω, the resistance of the third resistor 314 is 10 Ω, the resistance of the second resistor 312 is 5 Ω, the resistance of the fourth resistor 313 is 5 Ω, the voltage value of the first end of the shunt resistor is 10V and the voltage value of the second end of the shunt resistor is 5V, the voltage of 5 V may be applied to the first input terminal of the operational amplifier 320 and the voltage of 2.5V may be applied to the second input terminal of the operational amplifier 320.

On the other hand, if the resistance of the first resistor 311 is 10 Ω, the resistance of the third resistor 314 is 10 Ω, the resistance of the second resistor 312 is 1 Ω, the resistance of the fourth resistor 313 is 4 Ω, the voltage value of the first end of the shunt resistor is 10V and the voltage value of the second end of the shunt resistor is 5V, the voltage of 5V may be applied to the first input terminal of the operational amplifier 320 and the voltage of 4V may be applied to the second input terminal of the operational amplifier 320. Therefore, the difference in voltage between the first input terminal and the second input terminal of the operational amplifier 320 becomes small, so that the measured current value may also be small as compared with the actual current.

The current detecting apparatus described in FIG. 3 can be applied not only to the measurement of the current in the phase line as described above, but also to the measurement of the current flowing in other conductors. For example, when measuring the current of the B+line, the shunt resistor may be configured in the B+line and the current in the B+line can be measured by connecting the circuit shown in FIG. 3 to both ends of the shunt resistor.

As described above, according to the current detecting device of FIG. 3, the current flowing in the phase line or the B+line can be measured by using the ground type operational amplifier, which is less expensive than the floating type operational amplifier, so that there may have the advantage of reducing the total cost required.

Figure 4:
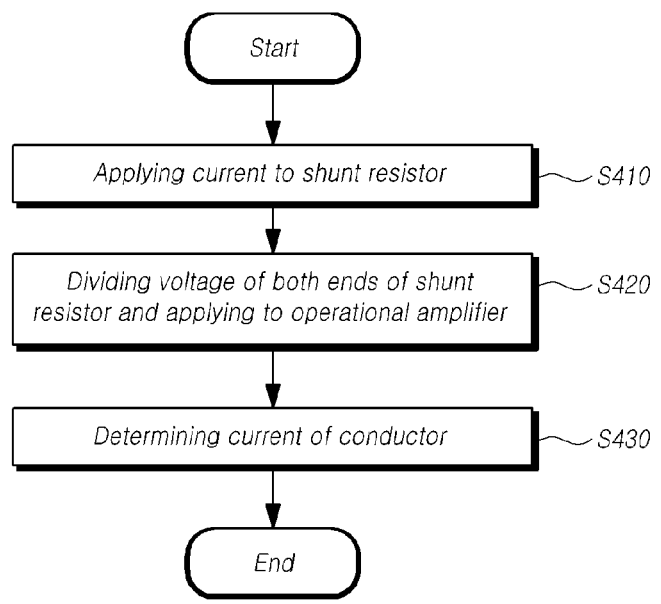
FIG. 4 is a diagram illustrating an example of a method of detecting the current of a conductor.

FIG. 4 is a diagram illustrating an example of a method of detecting the current of a conductor.

Hereinafter, an example will be described in which the present method is executed by the current detecting apparatus described with reference to FIG. 3.

Referring to FIG. 4, the current may be applied to the shunt resistor 310 connected to the conductor (e.g., a phase line)(S410). The current applied to the phase line may be applied to the motor connected to the phase line.

If the current is applied to the shunt resistor, voltage differences between the first and second ends of the shunt resistor 310 may be generated. At this time, the voltage at the first end of the shunt resistor 310 is divided by the first resistor 311 and the third resistor 314 so that the divided voltage may be applied to the first input terminal of the operational amplifier 320. At this time, the operational amplifier 320 may be the ground line operational amplifier.

The voltage of the second end of the shunt resistor 310 may be divided by the second resistor 312 and the fourth resistor 313 so that the divided voltage may be applied to the second input terminal of the operational amplifier 320 (S420).

In this case, in order to secure the accuracy of the current measurement as described above, the ratio of the resistance of the first resistor 311 to the resistance of the third resistor 314 may be set to be equal to the ratio of the resistance of the second resistor 312 to the resistance of the fourth resistor 313. Alternatively, the resistance of four resistors may be set so that the difference between the ratio of the resistance of the third resistor 314 to the resistance of the first resistor 311 and the ratio of the resistance of the fourth resistor 313 to the resistance of the second resistor 312 is less than or equal to the threshold value.

If the difference between the two ratio values is large, a difference occurs between the ratio of the voltage between the both ends of the shunt resistor 310 and the ratio of the voltage between the first input terminal and the second input terminal of the operational amplifier 320 so that the difference in the measured current value with respect to the actual current may become large.

In one embodiment, the ratio of the resistance of the third resistor 314 to the resistance of the first resistor 311 may be set to be equal to or less than a predetermined threshold ratio value. That is, the resistance of the third resistor 314 and the resistance of the first resistor 311 may be adjusted, so that the value of the actual voltage applied to the first input terminal of the operational amplifier 320 is smaller than the value of the voltage applied to the first input terminal of the operational amplifier 320 at a predetermined threshold ratio value. The threshold ratio value may be determined based on the maximum input possible voltage value of the operational amplifier 320 described above.

The voltage of the output terminal of the operational amplifier 320 is determined based on the voltage applied to the first input terminal of the operational amplifier 320 and the voltage applied to the second input terminal. The current of the conductor can be determined based on the voltage output at the output terminal of the operational amplifier 320 (S430).

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A current detecting apparatus of a conductor comprising:
    a shunt resistor connected to the conductor;
    an operational amplifier connected to the shunt resistor;
    a first resistor connected between the shunt resistor and a first input terminal of the operational amplifier;
    a second resistor connected between the shunt resistor and a second input terminal of the operational amplifier;
    a third resistor connected between a ground and the first input terminal of the operational amplifier; and
    a fourth resistor connected between the ground and the second input terminal of the operational amplifier.

2. The current detecting apparatus of claim 1, wherein the operational amplifier is a ground line operational amplifier.

3. The current detecting apparatus of claim 1, wherein a resistance of the first resistor and a resistance of the second resistor are the same, and a resistance of the third resistor and a resistance of the fourth resistor are the same.

4. The current detecting apparatus of claim 1, wherein a ratio of a resistance of the third resistor to a resistance of the first resistor is equal to a ratio of a resistance of the fourth resistor to a resistance of the second resistor.

5. The current detecting apparatus of claim 4, wherein the ratio of the resistance of the third resistor to the resistance of the first resistor is set to be equal to or less than a predetermined threshold ratio value.

6. The current detecting apparatus of claim 5, wherein the threshold ratio value is determined based on the maximum input possible voltage value of the operational amplifier.

7. A current detecting method of a conductor comprising:
    applying a current to a shunt resistor connected to the conductor;
    applying a voltage of a first end of the shunt resistor to a first input terminal of an operational amplifier by being voltage-divided through a first resistor and a third resistor, and applying a voltage of a second end of the shunt resistor to a second input terminal of the operational amplifier by being voltage-divided through a second resistor and a fourth resistor; and
    determining the current of the conductor based on the voltage of an output terminal of the operational amplifier,
    wherein the first resistor is connected between the shunt resistor and the first input terminal of the operational amplifier, the second resistor is connected between the shunt resistor and the second input terminal of the operational amplifier, the third resistor is connected between a ground and the first input terminal of the operational amplifier, and the fourth resistor is connected between the ground and the second input terminal of the operational amplifier.

8. The current detecting method of claim 7, wherein the operational amplifier is a ground line operational amplifier.

9. The current detecting method of claim 7, wherein a resistance of the first resistor and a resistance of the second resistor are the same, and a resistance of the third resistor and a resistance of the fourth resistor are the same.

10. The current detecting method of claim 7, wherein a ratio of a resistance of the third resistor to a resistance of the first resistor is equal to a ratio of a resistance of the fourth resistor to a resistance of the second resistor.

11. The current detecting method of claim 10, wherein the ratio of the resistance of the third resistor to the resistance of the first resistor is set to be equal to or less than a predetermined threshold ratio value.

12. The current detecting method of claim 11, wherein the threshold ratio value is determined based on the maximum input possible voltage value of the operational amplifier.

* * * * *